Figure 1:
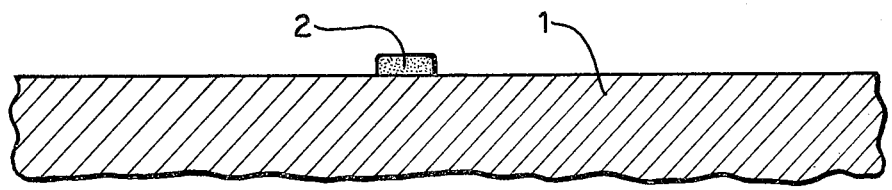
Figure 2:
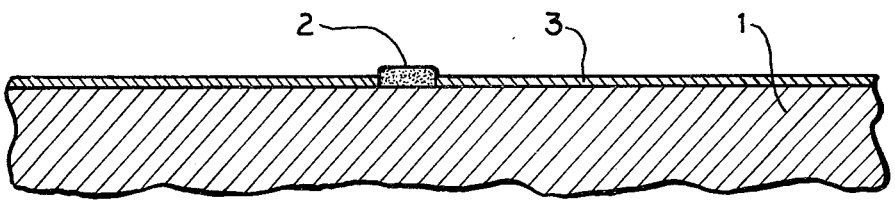

United States Patent [19]

Kraus

[11] 4,075,497

[45] Feb. 21, 1978

[54] ELECTRON-OPTICALLY RADIATABLE STRUCTURE

[75] Inventor: Heinz Kraus, Traunreut, Germany

[73] Assignee: Dr. Johannes Heidenhain GmbH, Traunreut, Germany

[21] Appl. No.: 645,924

[22] Filed: Dec. 31, 1975

[51] Int. Cl.² .......................................... G21K 1/00
[52] U.S. Cl. .................................. 250/505; 250/311
[58] Field of Search ............... 250/311, 396, 505, 510, 250/514

[56] References Cited

U.S. PATENT DOCUMENTS

| 3,227,880 | 1/1966 | Wideroe | 250/505 |
| 3,374,112 | 3/1968 | Danon | 250/311 |
| 3,421,000 | 1/1969 | Lieber et al. | 250/505 |
| 3,659,098 | 4/1972 | Politycki et al. | 250/505 |
| 3,847,689 | 11/1974 | Fletcher et al. | 250/311 |
| 3,988,153 | 10/1976 | Politycki | 250/505 |

*Primary Examiner*—Bruce C. Anderson
*Attorney, Agent, or Firm*—Hume, Clement, Brinks, William & Olds, Ltd.

[57] ABSTRACT

An improved, thin layer, metallic diaphragm structure for electron microscopes is disclosed having a very thin sheet member, approximately 0.5 to 1 micron thick, surrounding the aperture which is attached to and supported by a reinforcing member approximately 30 microns thick, set away from the aperture. Both the thin sheet member and the reinforcing member are formed from the same heavy metal, preferably gold. A modified object diaphragm structure is also disclosed which is provided with a meshlike screen extending across the aperture to support electron absorbing elements located in the middle of the aperture. The meshlike elements of the screen are of such a narrow design that they are not resolvable by the electron beam of the microscope.

11 Claims, 6 Drawing Figures

ELECTRON-OPTICALLY RADIATABLE STRUCTURE

The invention relates to an electron-optically radiatable, cantilever structure. Such structures are known in electron microscopes, for example, in the form of objective-aperture diaphragms, condensor aperture diaphragms but also as object structures. Both objective (viewing) apertures and condensor (radiation) apertures play an important part for the contrast in the finished image of an electron microscope. Particularly the objective aperture diaphragm whose diameter is from 10 to 100 microns represents a critical component, because this small opening has a tendency of becoming dirty when the length of the diaphragm perforation is relatively large, for example 30 microns long (Schimmel/-Vogell Collection of Methods of Electron Microscopy, Volume 1, 1.1.1, J. Stabenow, Thin Layer Aperture diaphragms, page 3 to 5). Such fouling causes an additional axial astigmatism and the quality of the picture is reduced.

From the same passage in literature it also is known already to produce so-called thin layer diaphragms to avoid the disadvantages of thick diaphragms; they are precipitated as a layer about 1 to 2 microns thick on a support, separated from this support and collected on a holding ring. The disadvantage of this embodiment is that it can be manufactured only under complicated conditions and in operation it fails to offer the desirable stability.

The invention is based on the problem of creating a structure of the initially described kind which is easy to manufacture, simple to operate, rugged in operation, immune against fouling and which has precisely defined edges to limit the electron beams.

The advantages of the invention are produced not only under the design of this structure as objective or condensor aperture diaphragm, but also when the structure is an object structure with holding screen. In that case the thinner area forms both the edges of the object structure and the holding screen of such narrow bridge width that it is no longer resolvable under further reduction.

The book by W. Reimers "Electron-Microscopic Methods of Examination and Preparation", Springer Publishing Co., volume 2, 1967, section: Measurement and Correction of Astigmatism, states on page 73 that it is possible, for the contrast-rich observation of Fresnel's diffraction fringes, to reinforce perforate foils with carbon or a heavy metal to increase the identifiability of the diffraction fringes at the foil edge. This design differs from the invention in that the reinforcement is extended as far as the edge causing the limiting of the electron beams. An edging to the aperture which is thinner than the thickness necessary for the inner mechanical strength of the foil thus does not exist in this prior art embodiment.

The structure according to the invention as well as the method used for its manufacture are shown schematically in the drawing.

Figure 6:
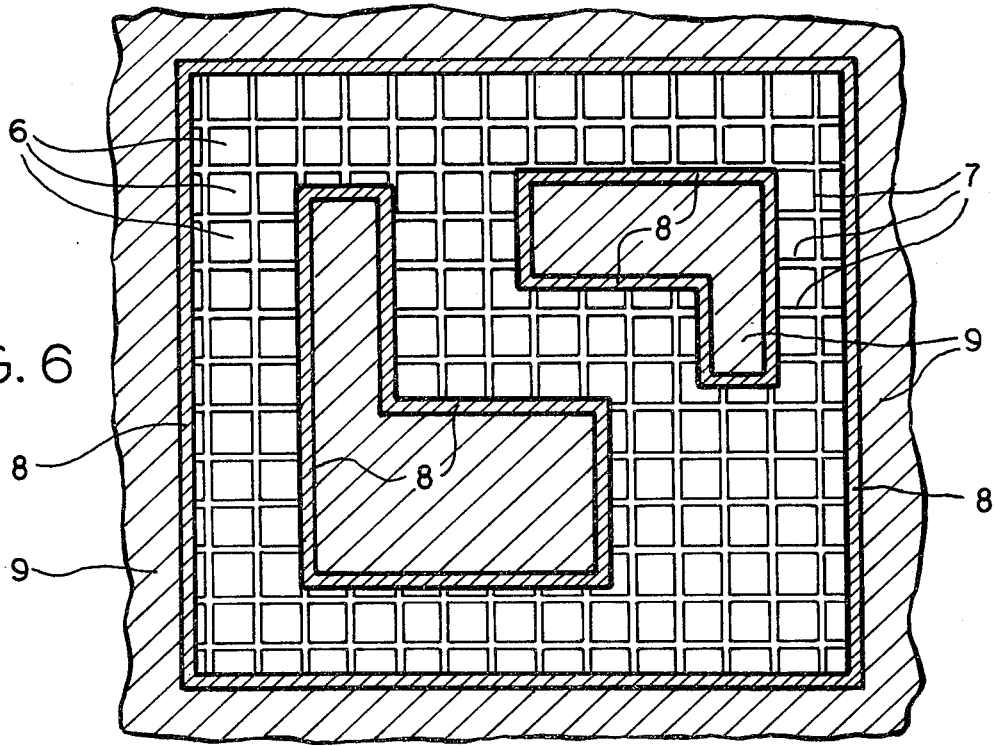

FIGS. 1 to 5 show the methodic steps for producing a diaphragm aperture according to the invention, FIG. 6 shows a top view on the object structure with holding screen according to the invention.

At first a covering layer 2 is applied to a support 1. The covering layer covers the support 1 so far as in the definitive structure the range 6 free from the material, that is in this case the exposed diaphragm opening or aperture, shall extend. As mentioned above already, in the case of an objective aperture, the diameter is from a few to 100 microns. Because of the requirement of the completely circular design for an objective-aperture diaphragm it is advisable to apply the cover layer 2 by way of the photo varnish technique. According to FIG. 2 now a heavy metal layer, for example a gold layer 3 is applied to the support 1 in such a manner that it can later be separated from the support. If the layer is applied galvanically, the electrically conductive support 1 necessary therefor may be so selected that the layer 3 can later be removed. If the layer 3 is vapored or sprayed on, an intermediate layer is recommended between support 1 and layer 3 which will facilitate the later removal. An example for such a layer is contained in the above mentioned collection of methods of electron microscopy on page 4. The layer thickness in the thin layer range is for example 0.5 to 1 micron, in the thick layer range, about 30 microns. Both with the galvanic application of the thin layer and under its vaporing on or spraying on, the removal from the support also is possible with the aid of a solvent dissolving the support only.

Figure 3:
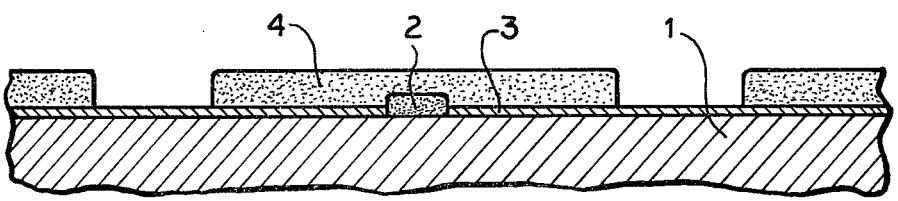
Figure 4:
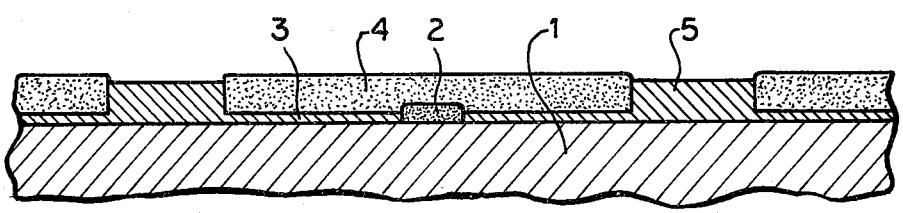
Figure 5:
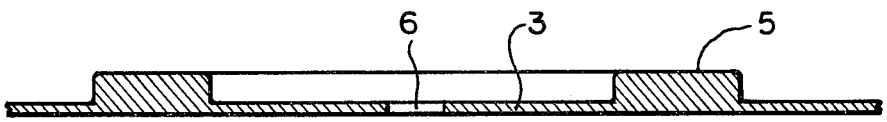

Thereon an additional cover layer 4 is applied according to FIG. 3, additionally in a surface area which in the finished structure shall occupy the thinner layer range. Thus the cover layer 4 is in a narrow zone along the edges of masking 2 on layer 3 and covers the latter. If then according to FIG. 4 a further separation of the same material takes place which already forms the layer 3, there will be a reinforcement 5 of layer 3, except for the places covered by the masking 4. The masking layers 2 and 4 then are removed and the structure is separated from the support 1 in a known manner. Their thinner surface areas 3 and their thicker surface areas 5 form a body consisting of a uniformly consistent material having at its edges the desired thickness, but for the remainder it is extremely rugged in use thanks to the reinforcement set off from the edges.

The invention also can be applied advantageously in the design of object structures used in an electron microscope as pattern for the electron-microscopic reduction of specimens as this is suggested already nowadays for the production of extremely small electronic components. These objects shall contain the patterns to be reproduced in the form of ranges alternately permeable and absorbing for electrons. For the purpose according to this example it is not always possible to provide the absorbing areas as being interconnected. As shown in FIG. 6, a connecting, meshlike, holding screen 7 provides for maintaining the reciprocal spaces of the individual absorbing surface ranges. The bridges or meshlike elements of the holding screen 7 are of such narrow design that they are no longer reproduced at the electron-microscopic reduction. Thereby the radiation-sensitive copy varnish used in the reduction may be dissolution-restrictive in the main. The actual object structure superposes this support screen. In their marginal areas 8 they have a thickness which adequately absorbs electrons, about 0.5 to 1 micron, so that the object structure can be pictured with sufficient richness in contrast. In the remaining surface ranges 9 which are recessed from the edge they have a substantially greater thickness, about 30 microns, which provides them with a greater interior strength. The production is accomplished analogously with the above described method for producing an aperture diaphragm. Thereby the same operation can be used for producing the holding screen 7 as for producing the thinner ranges 8, either simultaneously or consecutively. Although the layer thickness of the bridges according thereto corresponds approximately with that of the thinner ranges 8 which is sufficient for a contrast-rich picturing in the electron microscope, the holding screen 7 is not shown in the image because of its narrow bridge width.

What is claimed is:

1. A metallic, thin layer diaphragm, having an object structure which forms the pattern for the electron-microscopic reduction of objects, comprising:

an aperture for the passage of electron beams, the aperture being formed by a thin perimeter which surrounds and defines the aperture and by a reinforcing member of substantially greater thickness than the perimeter, set away from the aperture and adjacent to the perimeter, which forms a mechanical reinforcement for the perimeter;

at least one electron absorbing, object structure within the aperture, said structure having a thin periphery and an interior of substantially greater thickness than the periphery to provide mechanical reinforcement for the periphery;

a meshlike supporting screen, formed by a plurality of screen elements, extending across the aperture and connecting the object structure to the perimeter of the aperture to support the object structure within the aperture;

the elements of the screen having approximately the same thickness as the periphery of the object structure, the width of the elements being so narrow that they are not resolvable by the microscope's electron beam; and wherein the components of the diaphragm are formed from the same metal.

2. The diaphragm of claim 1, wherein the metal is gold.

3. The diaphragm of claim 1, wherein the thicknesses of the thin periphery and the screen elements are between about 0.5 and 1 micron.

4. The diaphragm of claim 1, wherein the thickness of the interior of the object structure is at least about 30 microns.

5. The diaphragm of claim 1, wherein the thicknesses of the perimeter of the aperture, the thin periphery and the screen elements are between about 0.5 and 1 micron and the thicknesses of the aperture's reinforcing member and the interior of the object structure is at least about 30 microns.

6. A metallic, thin layer diaphragm, having an object structure which forms the pattern for the electron-microscopic reduction of objects, comprising:

an aperture for the passage of electron beams, the aperture being formed by a thin perimeter which surrounds and defines the aperture and by a reinforcing member of substantially greater thickness than the perimeter, set away from the aperture and adjacent to the perimeter, which forms a mechanical reinforcement for the perimeter;

at least one electron absorbing, metallic object structure within the aperture, said structure having a periphery about 0.5 to 1 microns thick and an interior at least about 30 microns thick to provide mechanical reinforcement for the periphery;

a meshlike supporting screen, formed by a plurality of screen elements, extending across the aperture and connecting the object structure to the perimeter of the aperture to support the object structure within the aperture, the elements of the screen being about 0.5 to 1 microns thick, the elements being so narrow that they are not resolvable by the electron beam of the microscope; and wherein the diaphragm is formed from a consistently uniform metal.

7. The diaphragm of claim 6, wherein the metal is gold.

8. The diaphragm of claim 6, wherein the perimeter of the aperture is about 0.5 to 1 micron thick.

9. A metallic, thin layer diaphragm comprising:

a support structure;

an aperture within the support structure for the passage of electron beams;

at least one electron absorbing, object structure within the aperture, said object structure forming the pattern for the electron-microscopic reduction of objects, said object structure having a thin periphery and a substantially thicker interior which reinforces the periphery;

a meshlike holding screen, formed by a plurality of elements, extending across the aperture and connecting the object structure to the aperture's support structure to mount the object structure within the aperture, the elements of the screen having approximately the same thickness as the object structure's periphery, the elements being so narrow that they are not resolvable by the electron beam of the microscope; and wherein the object structure and the holding screen are formed from the same metal.

10. The diaphragm of claim 9, wherein the thicknesses of the thin periphery and the screen elements are between about 0.5 to 1 micron.

11. The diaphragm of claim 9, wherein the thickness of the interior of the object structure is at least about 30 microns.

* * * * *